(12) United States Patent
Hwang et al.

(10) Patent No.: US 12,500,118 B2
(45) Date of Patent: Dec. 16, 2025

(54) SEMICONDUCTOR DEVICE AND METHOD FOR MANUFACTURING THE SAME

(71) Applicant: DB HiTek Co., Ltd., Bucheon-si (KR)

(72) Inventors: Sang Il Hwang, Wonju-si (KR); Dae Il Kim, Cheongju-si (KR); Sung Hoon Lee, Cheongju-si (KR); Young Joon Choi, Ansan-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 355 days.

(21) Appl. No.: 18/183,375

(22) Filed: Mar. 14, 2023

(65) Prior Publication Data

US 2024/0312829 A1  Sep. 19, 2024

(51) Int. Cl.
| | | |
|---|---|---|
| *H01L 21/762* | (2006.01) | |
| *H01L 21/02* | (2006.01) | |
| *H01L 21/3213* | (2006.01) | |
| *H10D 62/17* | (2025.01) | |

(52) U.S. Cl.
CPC .. *H01L 21/76229* (2013.01); *H01L 21/02112* (2013.01); *H01L 21/3213* (2013.01); *H10D 62/393* (2025.01)

(58) Field of Classification Search
CPC ... H01L 21/116; H01L 21/393; H10D 62/116; H10D 62/393

USPC .......................................................... 257/506
See application file for complete search history.

(56) References Cited

U.S. PATENT DOCUMENTS

| | | | |
|---|---|---|---|
| 10,325,867 | B2 | 6/2019 | Cho et al. |
| 11,018,060 | B2 | 5/2021 | Kang et al. |
| 2011/0042777 | A1* | 2/2011 | Jhang ................ H01L 21/76232 257/E29.02 |
| 2016/0372429 | A1 | 12/2016 | Cho et al. |
| 2018/0166322 | A1* | 6/2018 | Lee ........................ H01L 21/764 |
| 2020/0343145 | A1* | 10/2020 | Kang ................. H10D 30/0227 |

FOREIGN PATENT DOCUMENTS

| | | |
|---|---|---|
| KR | 10-2003-0000592 A | 1/2003 |
| KR | 10-2016-0149432 A | 12/2016 |
| KR | 10-2020-0125873 A | 11/2020 |

\* cited by examiner

*Primary Examiner* — Fazli Erdem
(74) *Attorney, Agent, or Firm* — Central California IP Group, P.C.; Andrew D. Fortney

(57) ABSTRACT

Disclosed are a semiconductor device and a method of manufacturing the same. More particularly, a semiconductor device and a method of manufacturing the same are disclosed, including a device isolation structure with a pre-DTI structure and/or a DTI structure having at least one corner region with a cut shape/corner or truncation in a plan view, thereby reducing or preventing the occurrence of defects during formation of the device isolation structure and in a subsequent CMP process.

20 Claims, 14 Drawing Sheets

SEMICONDUCTOR DEVICE AND METHOD FOR MANUFACTURING THE SAME

BACKGROUND OF THE INVENTION

Field of the Invention

The present disclosure relates generally to a semiconductor device and a method of manufacturing the same. More particularly, the present disclosure relates to a semiconductor device and a method of manufacturing the same, including at least one corner of a device isolation structure has a cut shape in a plan view, thereby reducing or preventing defects from occurring during formation of the device isolation structure and in a subsequent CMP process.

Description of the Related Art

BCDMOS (Bipolar-CMOS-DMOS) technology frequently involves a high breakdown voltage of 100 V or more. In order to meet such a high voltage requirement, a deep trench isolation (DTI) region is used to electrically isolate (e.g., reduce or prevent an increase in leakage current) adjacent devices.

FIG. 1 is a reference cross-sectional view illustrating a DTI structure 910 in a conventional semiconductor device.

Referring to FIG. 1, the formation of the DTI structure 910 used for electrical isolation between adjacent devices. First, a trench is formed by etching a substrate 901 to a predetermined depth. Thereafter, the DTI structure 910 is formed by depositing an insulating material in the corresponding trench. As described above, when forming the DTI structure 910 using a single etching step, there is a technical limit to the depth of the trench. In other words, when forming the DTI structure by etching the substrate 901 in a single step, it is difficult for the DTI structure 910 to have a depth sufficient to electrically isolate adjacent devices. Also, after the trench is formed, a problem may occur when depositing the insulating material into the formed trench.

Due to such limitations, in particular, when the substrate 901 has a relatively large depth or thickness in order to realize a breakdown voltage (BV) of 100 V or more, the DTI structure may not be sufficiently deep. This leads to an increase in the electric field below the DTI structure and an increase in the leakage current, resulting in a decrease in the breakdown voltage. Thus, the distance between adjacent devices should be increased to prevent noise generation therebetween, thereby inevitably increasing the overall chip size.

To overcome the above problems, the present inventors have conceived a novel semiconductor device with an improved structure and a method of manufacturing the same, which will be described in detail later.

The foregoing is intended merely to aid in the understanding of the background of the present disclosure, and is not intended to mean that the present disclosure falls within the purview of the related art or subject matter that is already known to those skilled in the art.

Documents of Related Art

Korean Patent Application Publication No. 10-2003-0000592, entitled "Method for manufacturing of semiconductor device with STI/DTI structure."

SUMMARY OF THE INVENTION

Accordingly, the present disclosure has been made keeping in mind the above problems occurring in the related art, and an objective of the present disclosure is to provide a semiconductor device and a method of manufacturing the same, including a wide first trench (e.g., for a pre-DTI structure) and a separate narrow second trench (e.g., for a DTI structure), so that a resulting device isolation structure structure extends to a relatively large depth into the substrate, thereby improving isolation characteristics between adjacent devices and related device characteristics, and reducing the chip size.

Another objective of the present disclosure is to provide a semiconductor device and a method of manufacturing the same, including at least one corner having a cut shape in a plan view, to prevent an increase in the width of the corner, thereby reducing or preventing the occurrence of defects in a subsequent CMP process.

Still another objective of the present disclosure is to provide a semiconductor device and a method of manufacturing the same, including at least one corner having a cut shape in a plan view, to reduce or prevent an increase in the corner, thereby preventing exposure of an air gap and thus preventing deterioration of isolation characteristics.

In order to achieve the above objectives, according to one or more aspects of the present disclosure, there is provided a semiconductor device including a substrate; a gate electrode on the substrate; a first device isolation (e.g., shallow trench isolation, or STI) structure in the substrate; and a second device isolation structure at least partially overlapping the first device isolation structure, extending into the substrate, and having at least one corner with a cut side or truncation.

According to another aspect of the present disclosure, the second device isolation structure may include a pre-deep trench isolation (DTI) structure overlapping the first device isolation structure; and a DTI structure connected to the pre-DTI structure extending a predetermined distance into the substrate and/or from the pre-DTI structure, and having a narrower width than the pre-DTI structure.

According to another aspect of the present disclosure, the pre-DTI structure may include a first truncation in a corner region of the pre-DTI structure in a plan view thereof.

According to another aspect of the present disclosure, the DTI structure may include a second truncation on an outer edge of a corner region of the DTI structure in the plan view.

According to another aspect of the present disclosure, the corner region of the pre-DTI structure including the first truncation may have a width substantially equal to a width of other regions of the pre-DTI structure at a same height.

According to another aspect of the present disclosure, the DTI structure may include a second truncation in a corner region of the DTI structure in the plan view.

According to another aspect of the present disclosure, there is provided a semiconductor device including a substrate; a gate electrode on the substrate; a first device isolation structure (e.g., an STI structure or other device isolation layer) in the substrate; and a second device isolation structure at least partially overlapping the first device isolation structure and extending into the substrate, wherein the second device isolation structure may include a pre-DTI structure overlapping the first device isolation structure; and a DTI structure connected to the pre-DTI structure and extending a predetermined distance into the substrate and/or from the pre-DTI structure, and having a narrower width than the pre-DTI structure, wherein the pre-DTI structure may include a first truncation in a corner region of the pre-DTI structure in a plan view thereof (e.g., of the second device isolation structure or the pre-DTI structure), and the DTI structure may include a second truncation in a corner region of the DTI structure in the plan view (e.g., of the second device isolation structure or the DTI structure).

According to another aspect of the present disclosure, the first truncation may be on an outer edge of the corner region of the pre-DTI structure, and the second truncation may be on an outer edge of the corner region of the DTI structure.

According to another aspect of the present disclosure, each of the first truncation and the second truncation may have a shape resulting from cutting a corresponding corner region one time.

According to another aspect of the present disclosure, each of the first truncation and the second truncation may have a shape resulting from cutting a corresponding corner region at least two times.

According to another aspect of the present disclosure, the semiconductor device may further include a buried layer having a second conductivity type in the substrate; a deep well directly or indirectly connected to the buried layer; a first well in the deep well; a drain in the first well and at a surface of the substrate; a body region having a first conductivity type in the substrate; and a source in the body region and at the surface of the substrate.

According to another aspect of the present disclosure, the first cut corner region may have a width differing from a width of other regions of the pre-DTI structure by not more than about 10%.

According to another aspect of the present disclosure, the second corner region may have a width differing from a width of other regions of the DTI structure by not more than about 10%.

According to another aspect of the present disclosure, the second device isolation structure may further include an air gap.

According to another aspect of the present disclosure, there is provided a method of manufacturing a semiconductor device, the method including forming a first device isolation structure (e.g., an STI structure) in a substrate; forming a gate electrode on the substrate; forming an interlayer insulating layer on the substrate and the gate electrode; forming an pre-DTI structure overlapping the first device isolation structure, wherein the pre-DTI structure has at least one first cut corner or truncation in a plan view; and forming a DTI structure in the substrate, wherein the DTI structure has (i) a narrower width than the pre-DTI structure and (ii) at least one corner region with a second cut corner or truncation in the plan view, wherein the DTI structure is in contact with the pre-DTI structure.

According to another aspect of the present disclosure, forming the pre-DTI structure may include etching the interlayer insulating layer and the first device isolation structure to form a first trench; and depositing an insulating layer in the first trench. Forming the first trench may include forming a first patterned photoresist layer on the interlayer insulating layer having an opening corresponding to the first trench and in which at least one corner region of the first trench includes a cut corner or truncation in the plan view.

According to another aspect of the present disclosure, forming the DTI structure may comprise, after forming the first trench, etching the substrate in the first trench to form the second trench; and depositing an insulating layer in the second trench. In a further aspect, forming the second trench may comprise forming a second patterned photoresist layer on the interlayer insulating layer and in the first trench having an opening corresponding to the second trench and in which at least one corner region of the second trench includes a cut corner or truncation in the plan view; and etching the substrate exposed by the opening to form the second trench.

According to another aspect of the present disclosure, a width of the pre-DTI structure may be substantially uniform as a function of depth into the substrate (e.g., along a longest axis or an extension direction thereof).

The present disclosure has the following effects by the above configuration.

The relatively wide first trench for the pre-DTI structure and the relatively narrow second trench for the DTI structure are formed separately, so that the second device isolation structure easily extends deep into the substrate, thereby improving isolation characteristics between adjacent devices and device characteristics, and reducing the chip size.

Furthermore, at least one corner region of the pre-DTI structure and/or the DTI structure has a cut shape or truncation in a plan view, thereby maintaining or reducing the width of the pre-DTI structure and/or the DTI structure in the corner region, and reducing or preventing occurrence of defects in a subsequent CMP process.

Moreover, at least one corner region of the pre-DTI structure and/or the DTI structure has a cut shape or truncation in a plan view, maintaining or reducing the width of the pre-DTI structure and/or the DTI structure in the corner region, thereby avoiding exposure of an air gap in the DTI structure (and possibly in a lower part of the pre-DTI structure), and reducing or preventing deterioration of isolation characteristics.

Meanwhile, the effects of the present disclosure are not limited to the above-mentioned effects, and other effects not mentioned above can be clearly understood from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
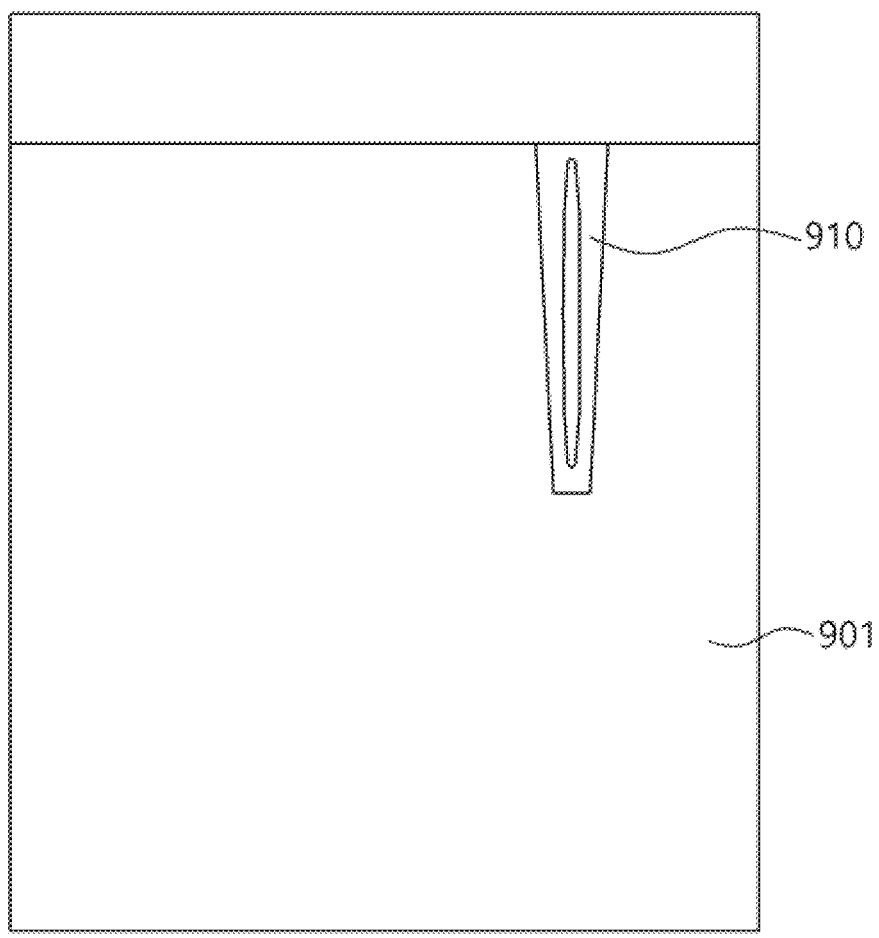
FIG. 1 is a reference cross-sectional view illustrating a DTI structure in a conventional semiconductor device.

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those skilled in the art.

As used herein, when an element (or layer) is referred to as being on another element (or layer), it can be directly on the other element, or one or more intervening elements (or layers) may be therebetween. In contrast, when an element is referred to as being directly on or above another component, no intervening elements are therebetween. Further, the terms "on", "above", "below", "upper", "lower", "one side", "side surface", etc. are used to describe one element's positional relationship to one or more other elements illustrated in the drawings.

While the terms "first", "second", "third", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time, or performed in an order opposite to the described order.

The term "metal-oxide-semiconductor" or "MOS" used herein is a generally-recognized term. "M" is not limited to only metal, and may include various types of conductors. "S" may be a substrate or a semiconductor. "O" is not limited to only oxide, and may include various types of organic or inorganic dielectric materials.

In addition, the conductivity type of a doped region or element may be defined as "P-type" or "N-type" according to the main carrier characteristics. However, this is only for convenience of description, and the technical spirit of the present disclosure is not limited to the above-mentioned examples. For example, "P-type" or "N-type" may be replaced with the more general terms "first conductivity type" or "second conductivity type" hereinafter, where the first conductivity type may refer to the P type and the second conductivity type may refer to the N type.

It should be further understood that the terms "heavily doped" and "lightly doped" representing the doping concentration of an impurity region generally refer to a relative concentration or dose of dopant elements therein.

Figure 2:
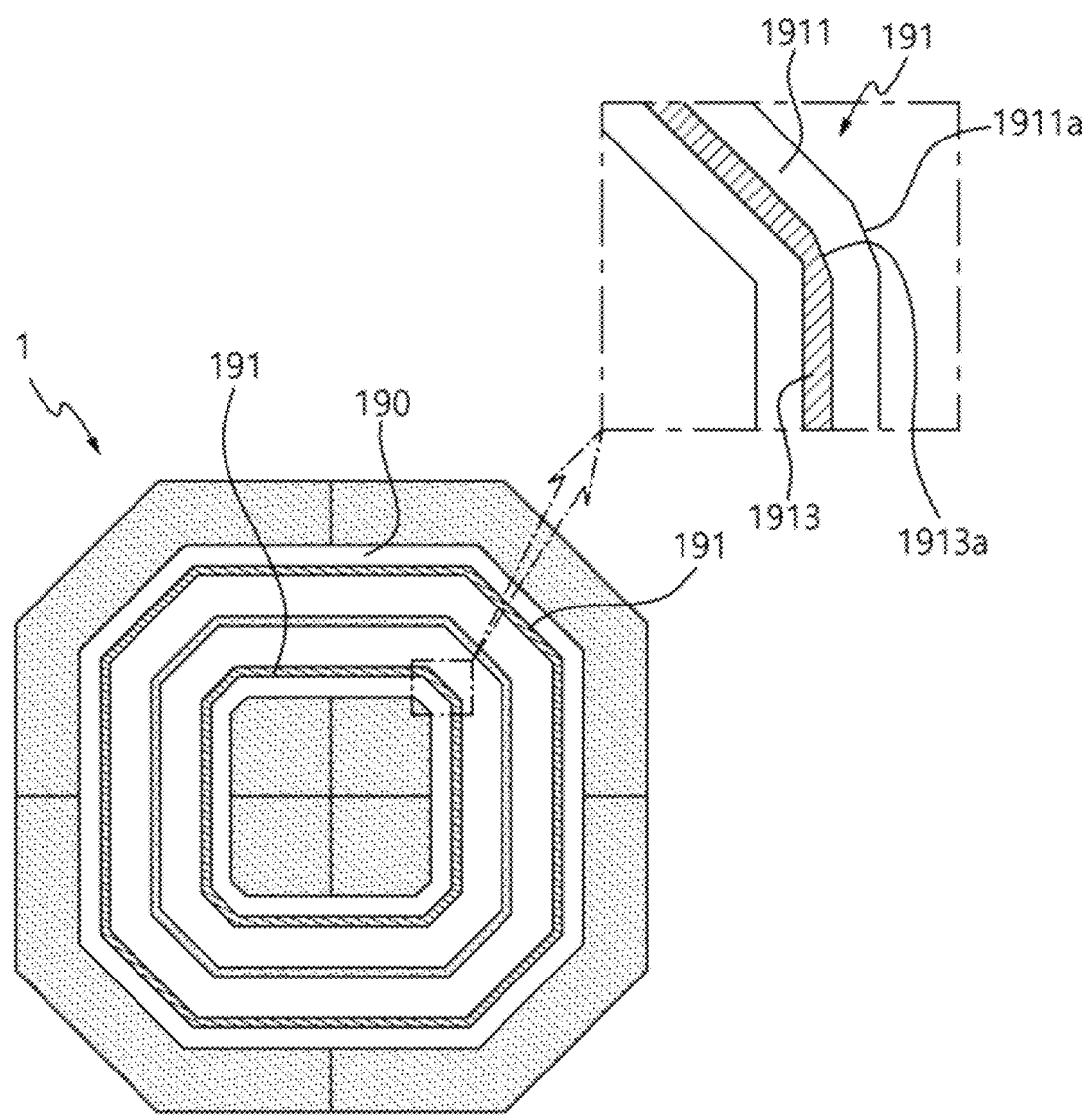
FIG. 2 is a schematic plan view illustrating a semiconductor device according to an embodiment of the present disclosure.
Figure 3:
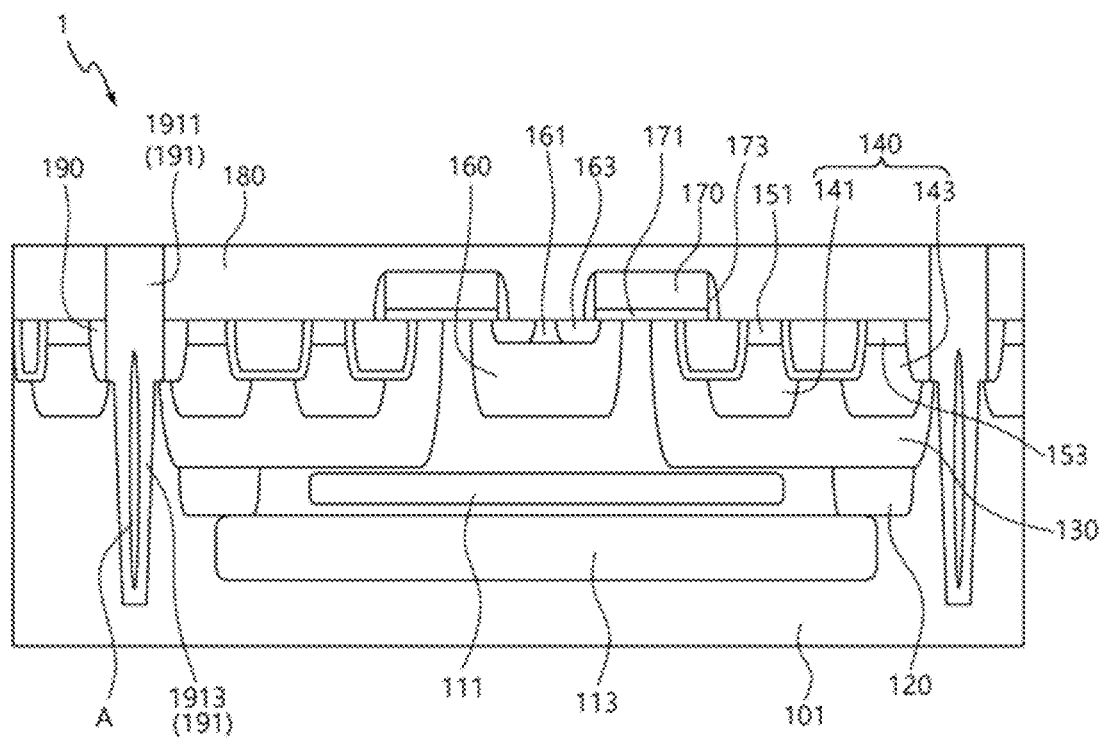
FIG. 3 is a cross-sectional view of the semiconductor device illustrated in FIG. 2.

FIG. 2 is a schematic plan view illustrating a semiconductor device 1 according to an embodiment of the present disclosure. FIG. 3 is a cross-sectional view illustrating the semiconductor device 1 illustrated in FIG. 2.

Hereinafter, the semiconductor device 1 according to an embodiment of the present disclosure will be described in detail with reference to the accompanying drawings.

Referring to FIGS. 2 and 3, the present disclosure relates generally to the semiconductor device 1. More particularly, the present disclosure is exemplified by the semiconductor device 1, which includes a device isolation structure 191 having a pre-DTI structure 1911 and/or a DTI structure 1913 of with at least one corner region that has a cut shape or truncation 1911a and/or 1913a in a plan view, thereby reducing or preventing the occurrence of defects during formation of the device isolation structure 191 and in a subsequent CMP process.

It is to be understood that the above-described "corner region" means a region of each of the pre-DTI structure 1911 and the DTI structure 1913 containing a bend or angle, the pre-DTI structure 1911 and the DTI structure 1913 together having a substantially polygonal shape in the plan view. In the actual device 1, the plan view of the pre-DTI structure 1911 and the DTI structure 1913 is such that each side is not a substantially perfect straight line, but is generally entirely curved. In the present disclosure, it is to be understood that a "cut corner region" or "truncation" in the pre-DTI structure 1911 and/or the DTI structure 1913 refers to a corner region having dimensions outside the target range for the uncut or unmodified pre-DTI and DTI structures 1911 and 1913 (i.e., the target value of the dimensions, plus or minus allowable manufacturing or processing error[s]).

It is to be further understood that an "outer edge" means an edge that is relatively distant from the center of the device in the plan view of the pre-DTI structure 1911 and DTI structure 1913, and an "inner edge" means an edge opposite to the outer edge and closer to the center of the device than the outer edge.

Hereinafter, the structure of the semiconductor device 1 according to an embodiment of the present disclosure will be described in detail.

First, a well defining at least in part an active region may be in a substrate 101. This active region may be (further) defined by a first device isolation structure 190 serving as a device isolation layer. In addition, the substrate 101 may comprise a substrate having a first conductivity type, a P-type diffusion region in a substrate, or a P-type epitaxial layer (e.g., formed by epitaxial growth) on a single-crystal silicon substrate. The first device isolation layer 190 may be formed by shallow trench isolation (STI), but is not limited thereto.

The substrate 101 may contain a first buried layer 111 and a second buried layer 113. For example, the first buried layer 111 may be above the second buried layer 113. In addition, a high voltage well 120 may be connected to the second buried layer 113 in a region thereof not covered by or overlapping the first buried layer 111. The high voltage well 120 (e.g., HVNWELL) may comprise an ion implantation region having a second conductivity type, and may be on the second buried layer 113 in the substrate 101. The first buried layer 111 may be an impurity region having the first conductivity type, and the second buried layer 113 may be an impurity region having the second conductivity type. It should be noted that the first buried layer 111 and the high voltage well 120 are not essential components of the present disclosure, and may be omitted in some cases.

A deep well 130 may be on the high voltage well 120 in the substrate 101. The deep well 130 may be connected to the high voltage well 120, and may comprise an impurity region (DNWELL) having the second conductivity type. In some cases, the deep well 130 may be directly connected to the second buried layer 113.

In addition, a pair of wells 140 having the second conductivity type may be spaced apart in the deep well 130. A drain 151 may be in a first well 141, and a heavily doped region 153 may be in a second well 143. The drain 151 may comprise an impurity region having the second conductivity type, and may have a higher concentration of impurities than the first well 141. Also, the heavily doped region 153 may comprise an impurity region having the second conductivity type, and may have a higher concentration of impurities than the second well 143.

The drain 151 and the heavily doped region 153 are preferably at an uppermost surface of the substrate 101. The heavily doped region 153 may function as a guard ring together with the second well 143, to reduce leakage current and improve the safe operating area (SOA) of the device. The drain 151 may be electrically connected to a drain electrode. The first well 141 surrounding the drain 151 may be a drain extension region and may improve the breakdown voltages of the high-voltage semiconductor device.

A body region 160 may be in the substrate 101. The body region 160 may comprise a heavily doped region having the first conductivity type, and may be spaced apart from the deep well 130. In addition, a source 163 may be in the body region 160, at the surface of the substrate 101. The source 163 may comprise a heavily doped region having the first conductivity type and may be electrically connected to a source electrode. In addition, a body contact region 161 may be in the body region 160, adjacent to or in contact with the source 163. The body contact region 161 may comprise a heavily doped region having the first conductivity type.

A gate electrode 170 may be on the substrate 101. In detail, the gate electrode 170 may be between the drain 151 and the source 163 in the active region. The gate electrode 170 may be over a channel region of the device. The channel region may be turned on (e.g., allow flow of a carrier) or off (e.g., prevent flow of a carrier) in response to a voltage applied to the gate electrode 170. The gate electrode 170 may comprise a conductive polysilicon, a metal, a conductive metal nitride, or a combination thereof, and may be formed by chemical vapor deposition (CVD), physical vapor deposition (PVD), atomic layer deposition (ALD), metal-organic atomic layer deposition (MOALD), or metal-organic chemical vapor deposition (MOCVD).

In addition, a gate insulating layer 171 may be between the gate electrode 170 and the surface of the substrate 101. The gate insulating layer 171 may comprise a silicon dioxide layer, a high-k dielectric layer, or a combination thereof. The gate insulating layer 171 may be formed by ALD, CVD, thermal oxidation, or PVD.

In addition, a gate spacer 173 may be adjacent to (e.g., on a sidewall of) the gate electrode 170. The gate spacer 173 may comprise an oxide layer, a nitride layer, or a combination thereof.

In addition, an interlayer insulating layer 180 may be on the substrate 101 and may entirely cover the gate electrode 170. The interlayer insulating layer 180 may comprise, for example, a borophosphosilicate glass (BPSG) layer, a silicon oxide layer made from tetraethyl orthosilicate (TEOS), un undoped silica glass (USG) layer, and/or a silicon nitride etch stop layer, but is not limited thereto. The interlayer insulating layer 180 may also cover a second device isolation structure 191 which will be described later, and a detailed description thereof will be provided in a description of a method of manufacturing a semiconductor device which will be described later.

The first device isolation structure 190 may extend from the surface of the substrate 101 to a predetermined depth into the substrate 101. The first device isolation structure 190 may comprise a device isolation layer defining the active region as described above, and may be formed by, for example, shallow trench isolation (STI). In addition, the second device isolation structure 191 may overlap or surround (e.g., horizontally) the first device isolation structure 190 (or an upper portion thereof, as shown in FIG. 3). The second device isolation structure 191 may include a DTI structure, and passes through the first device isolation structure 190 in order to maintain the area of the active region.

The second device isolation structure 191 may include the pre-DTI structure 1911 and the DTI structure 1913. The pre-DTI structure 1911 may pass through or be surrounded (e.g., horizontally) by the interlayer insulating layer 180 and the first device isolation structure 190, and may, for example, have a lowermost surface at substantially the same or a similar height or depth as a lowermost surface of the first device isolation structure 190.

In addition, referring to FIGS. 2 and 3, the pre-DTI structure 1911 preferably has a width narrower than that of the first device isolation structure 190. The DTI structure 1913 may be under the pre-DTI structure 1911 and may be connected to or in contact with the pre-DTI structure 1911. The DTI structure 1913 may have a width that gradually narrows as a function of depth, such that lateral walls thereof are inclined towards a central axis of the DTI structure 1913, rather than extending vertically. This is because, when the substrate 101 is etched, the etch strength may decrease (e.g., an etchant residue is deposited along the sidewalls) as the etch depth increases. On the contrary, the pre-DTI structure 1911 may have a substantially uniform width or may include a portion that becomes gradually wider as a function of depth, but is not limited thereto. In addition, the DTI structure 1913 may have a width narrower than that of the pre-DTI structure 1911. Both the pre-DTI structure 1911 and the DTI structure 1913 preferably comprise a material in the interlayer insulating layer 180.

An air gap A may be in the second device isolation structure 191. For example, the air gap A may extend from a position adjacent to or near a bottommost surface of the DTI structure 1913 to a position adjacent to or near a top of the DTI structure 1913. Alternatively, the air gap A may have an uppermost end extending into the pre-DTI structure 1911. In addition, the air gap A preferably does not extend to a top (e.g., an upper half) of the pre-DTI structure 1911. This is to prevent a metal material such as tungsten (W) from entering into the air gap A in a subsequent process for forming a contact or via, thereby reducing or preventing deterioration of device characteristics.

Unlike the present disclosure, which includes a second device isolation structure 191 comprising a pre-DTI structure 1911 and a DTI structure 1913, when forming a DTI structure using a single etching step to form the trench and then depositing the dielectric material inside the trench, there is a technical limit to the depth to which the trench can be formed. In other words, when forming the DTI structure using a single etching step on the substrate 101, it is difficult for the DTI structure to have a depth sufficient to fully electrically isolate adjacent devices. In addition, it is inevitably difficult to deposit an insulating material deep within the trench. In particular, when the substrate 101 is relatively deep in order to realize a breakdown voltage (BV) of 100 V or more, the DTI structure made using a single etching step generally cannot have a sufficient depth. This leads to an increase in the electric field below the DTI structure and an increase in the leakage current, resulting in a decrease in the breakdown voltage. Thus, the distance between adjacent devices must be increased to reduce or prevent noise generation therebetween, thereby inevitably increasing the overall chip size.

In order to solve the above problems, the semiconductor device 1 according to embodiments of the present disclosure includes a second device isolation structure 191 including a pre-DTI structure 1911 having a relatively large width and a DTI structure 1913 having a relatively narrow width using an additional etching process, whereby the second device isolation structure 191, and in particular, the DTI structure 1913 has a sufficient depth. As described above, the depth of the second device isolation structure 191 is preferably in the range of 30 to 40 µm from the surface of the substrate 101.

Figure 4:
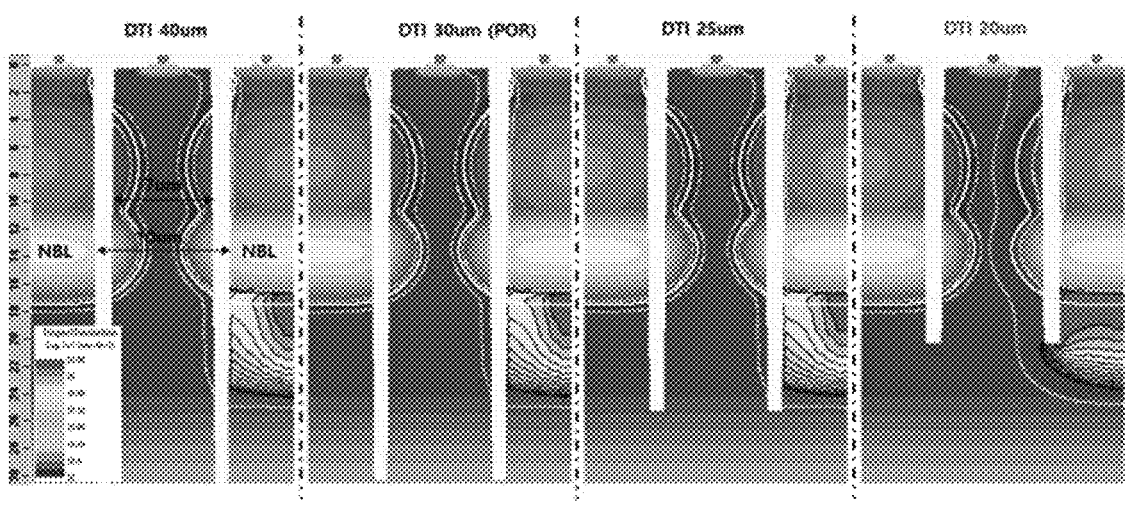
FIG. 4 is a graph illustrating isolation characteristics of a semiconductor device according to an embodiment of the present disclosure as a function of the depth of the second device isolation structure (or DTI structure)

FIG. 4 is a graph illustrating isolation characteristics of a device representative of the present disclosure as a function of the depth of the second device isolation structure (or DTI structure).

As can be seen from FIG. 4, when the depth of the DTI structure is in the range of 20 to 25 µm, the electric field below the DTI structure is relatively high in comparison to the same DTI structure having a depth of 30 µm or greater as in the present disclosure. The DTI structure having a depth of 30 µm or greater effectively prevents any increase in the electric field below the DTI structure, thereby improving the isolation characteristics of the device relative to an otherwise identical device having a DTI structure with a depth in the range of 20 to 25 µm.

Referring to FIG. 2, at least one corner region of the pre-DTI structure 1911 and/or the DTI structure 1913 has a cut shape or truncation in a plan view (e.g., a view from above the device 1, as shown in FIG. 2). In detail, at least one corner region of the pre-DTI structure 1911 having a polygonal shape in a plan view may have a cut corner or truncation 1911a. The truncation 1911a may be along the outer edge, the inner edge, or both the inner edge and the outer edge of the pre-DTI structure 1911, and is preferably along the outer edge thereof. By providing the cut corner or truncation 1911a as described above, it is possible to prevent the width of the pre-DTI structure 1911, which may have a sharp bend or angle in the plan view (e.g., in an extension direction on the horizontal plane), from increasing in the horizontal direction compared to other regions (e.g., of the pre-DTI structure 1911).

The cut corner or truncation may also be in a corresponding corner region of the DTI structure 1913. In this case, the cut corner or truncation 1911a described above is referred to as a first cut corner or truncation, and a cut corner or truncation 1913a in the DTI structure 1913 is referred to as a second cut corner or truncation. The second cut corner or truncation 1913a in the DTI structure 1913 may be in parallel with the first truncation 1911a in the same device 1, or alternatively, only one of the first truncation 1911a and the second truncation 1913a may be present, but the present disclosure is not limited thereto. As in the case of the first truncation 1911a, the second truncation 1913a may be along the outer edge and/or the inner edge of the DTI structure 1913, and is preferably along the outer edge. In addition, the first cut corner or truncation 1911a and the second cut corner or truncation 1913a are preferably in all corner regions of the pre-DTI structure 1911 and the DTI structure 1913, but are not limited thereto.

The first cut corner or truncation 1911a and the second cut corner or truncation 1913a may have any shape in which one side of a corner region of each of the pre-DTI structure 1911 and the DTI structure 1913 is cut or truncated, in addition to the above-described shapes.

Figure 5A:
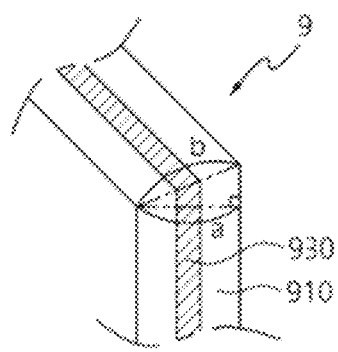
FIGS. 5A, 5B, and 5C are reference views illustrating a semiconductor device that does not include a cut corner region or truncation.
Figure 5B:
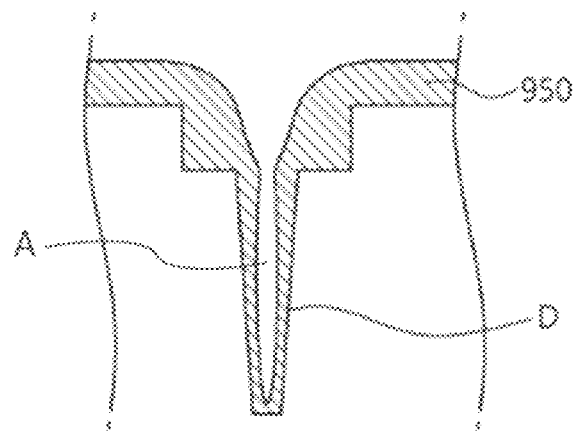
Figure 5C:
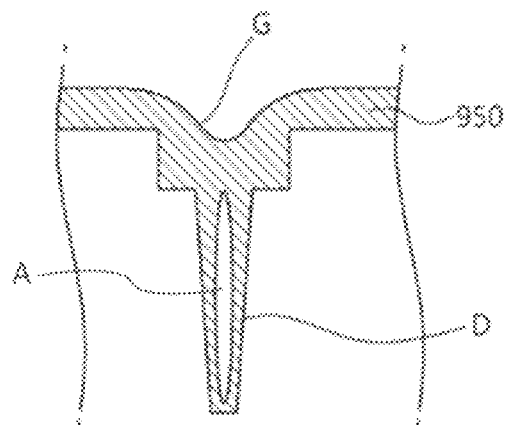
Figure 6A:
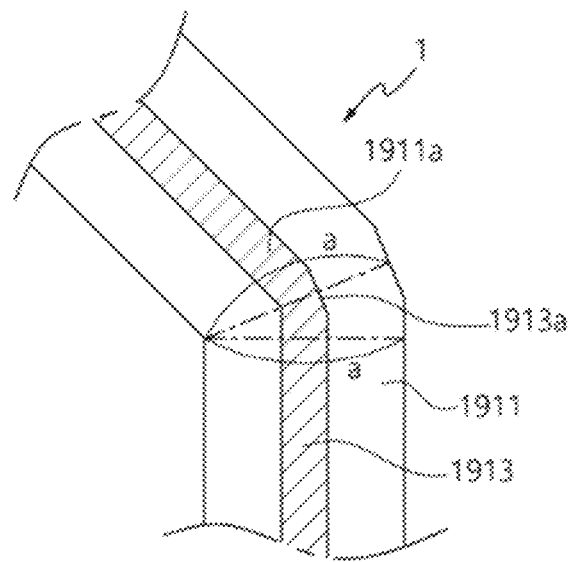
FIGS. 6A and 6B are reference views illustrating exemplary shapes of cut corner regions in the semiconductor device according to embodiments of the present disclosure.
Figure 6B:
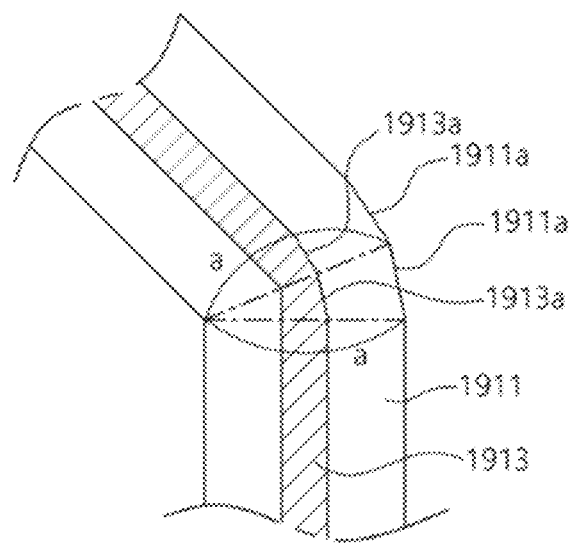

FIGS. 5A, 5B, and 5C are reference views illustrating a semiconductor device 9 without a cut corner or truncation. FIGS. 6A and 6B are reference views illustrating shapes of corner regions of the semiconductor device 1 according to embodiments of the present disclosure.

Hereinafter, a comparative description will be given between the comparative semiconductor device 9 without the cut corners or truncations 1911a and 1913a and the semiconductor device 1 according to an exemplary embodiment of the present disclosure.

Referring to FIG. 5A, in the case of the semiconductor device 9, when a pre-DTI structure 910 and a DTI structure 930 have an octagonal shape in the plan view, the width (the shortest distance between the outer edge and the inner edge) of the pre-DTI structure 910 outside the corner region is a, and the width in the corner region is b, where b corresponds to the hypotenuse of a right triangle with a as the base. In such a case, a<b.

Thus, referring to FIG. 5B, the width of the DTI structure 930 as well as the pre-DTI structure 910 in the corner region is inevitably larger than that of other regions of the DTI and pre-DTI structures 930 and 910 (i.e., regions outside the corner region). In this case, when depositing an insulating layer 950 in a deep trench D during the formation of the pre-DTI structure 910 and the DTI structure 930, there is a possibility that an air gap A will be open. This may result in deterioration of isolation characteristics. Also, referring to FIG. 5C, even when the air gap A is closed, a relatively wide and deep groove G may form in the insulating layer 950 in the corner regions compared to other regions, so there is a high possibility that residues remain in the groove G. This may cause a problem in which the corner region is removed (e.g., torn off) together with the material intended to be removed in a subsequent CMP process.

In order to solve the above problems, referring to FIG. 6, the semiconductor device 1 according to embodiments of the present disclosure includes a first cut corner or truncation 1911a and/or a second cut corner truncation 1913a, thereby reducing the width of the pre-DTI structure 1911 and/or the DTI structure 1913 in the corner region relative to other regions of the pre-DTI structure 1911 and the DTI structure 1913. The corner region with the first cut corner or truncation 1911a preferably has a difference of about 10% or less in width, compared to the width of other regions of the pre-DTI structure 1911. The corner region with the second cut corner or truncation 1913a also preferably has a difference of about 10% or less in width, compared to the width of other regions of the DTI structure 1913.

Within the above numerical width difference ranges, the first cut corner or truncation 1911a and the second cut corner or truncation 1913a may have any arbitrary shape in the plan view. For example, the first truncation 1911a or the second truncation 1913a may have a shape resulting from cutting or truncating a corresponding corner region one time (see FIG. 6A). Alternatively, the first or second truncation 1911a or 1913a may have a shape formed by cutting a corresponding corner region at least two times (see FIG. 6B), but is not limited thereto.

Figure 7A:
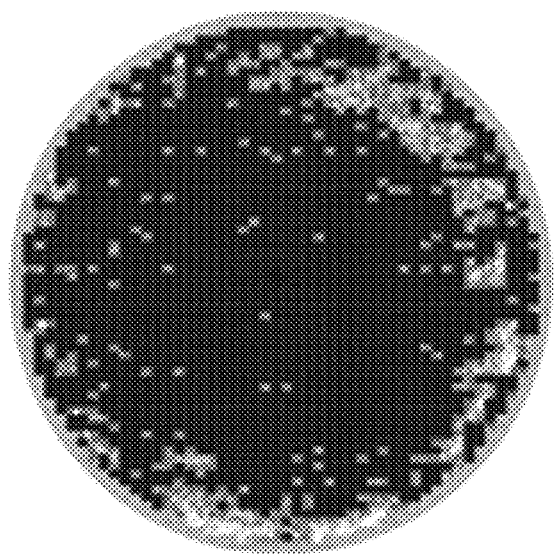
FIGS. 7A and 7B are SEM images comparing the occurrence of defects in a semiconductor device according to an embodiment of the present disclosure and a semiconductor device that does not include a cut corner region or truncation.
Figure 7B:
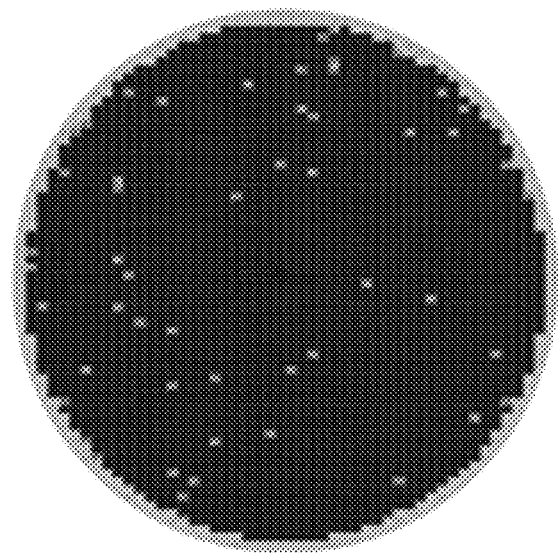

FIGS. 7A and 7B are SEM images illustrating a comparison between the semiconductor device 1 according to the present disclosure and the comparative semiconductor device 9 in the occurrence of defects. FIG. 7A illustrates an SEM image of the semiconductor device 9, and FIG. 7B illustrates an SEM image of the semiconductor device 1 according to the present disclosure. In the SEM images, the relatively light parts or areas indicate the location where a defect occurred.

Hereinafter, a comparative description will be given regarding the occurrence of defects in the comparative semiconductor device 9 and the semiconductor device 1 according to the present disclosure.

The semiconductor device 1 according to the present disclosure included the first cut corner or truncation 1911a and the second cut corner or truncation 1913a on the outer edges of respective corner regions of the pre-DTI structure 1911 and the DTI structure 1913, respectively. The distance between the inner and outer edges of the DTI structure 1913 adjacent to the second truncation 1913a was in the range of about 1.47 to 1.50 µm, and the length of the second truncation 1913a (e.g., along the outer edge of the DTI structure 1913) was about 1.00 µm. In the comparative semiconductor device 9, the distance between the inner and outer edges of the DTI structure 930 was in the range of about 1.47 to 1.50 µm.

Referring to the SEM images of the comparative semiconductor device 9 and the semiconductor device 1 according to the present disclosure (see FIGS. 7A and 7B), it can be seen that in the case of the semiconductor device 1 according to the present disclosure, a significantly reduced occurrence of defects in the corner region is observed.

FIGS. 8 to 15 are cross-sectional views illustrating a method of manufacturing a semiconductor device according to one or more embodiments of the present disclosure.

Hereinafter, a method of manufacturing a semiconductor device according to an embodiment of the present disclosure will be described in detail with reference to the accompanying drawings. For convenience of description, descriptions of wells, the buried layer, the source, and the drain in the substrate and the gate electrode on the substrate will be omitted, and processes before and after formation of the second device isolation structure 191 will be mainly described.

Figure 8:
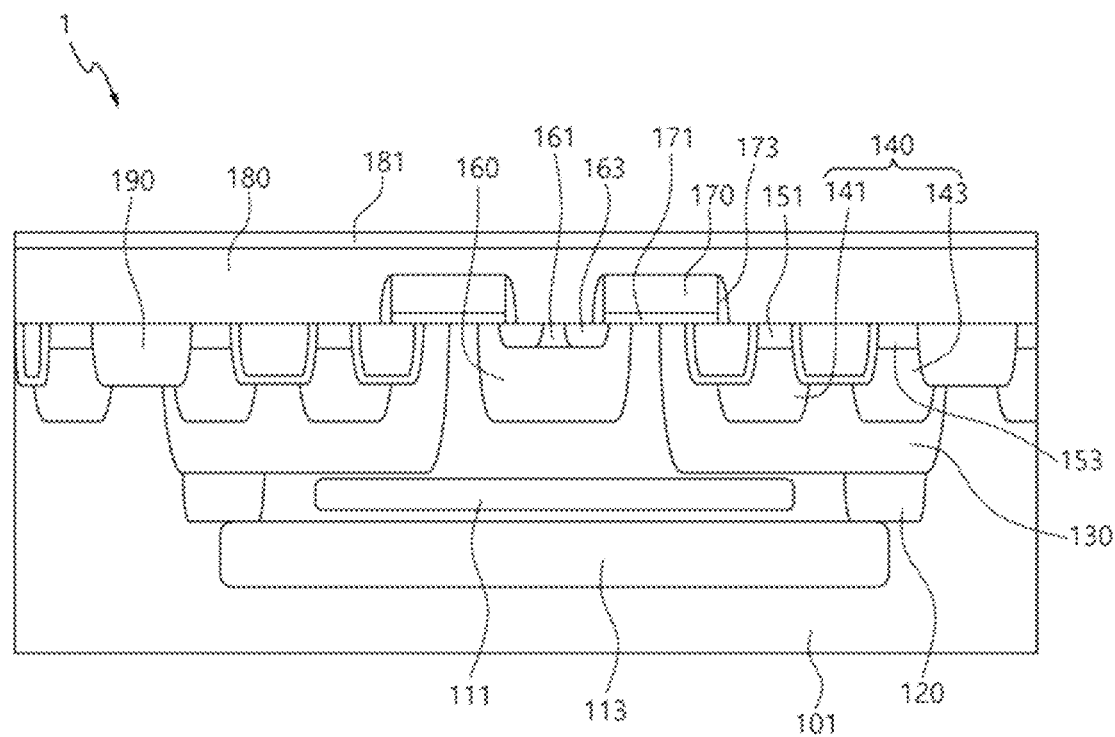
FIGS. 8 to 15 are cross-sectional views illustrating a method of manufacturing a semiconductor device according to embodiments of the present disclosure.

First, referring to FIG. 8, an interlayer insulating layer 180 may be deposited on the gate electrode 170 and the substrate 101. As described above, the interlayer insulating layer 180 may comprise, for example, a BPSG layer, a USG layer and/or a TEOS layer, but is not limited thereto. Thereafter, an etch or polish stop layer 181 may be formed on the interlayer insulating layer 180. The etch or polish stop layer 181 may comprise a polish stop layer for a subsequent chemical mechanical polishing (CMP) process, and may comprise, for example, a SiN layer.

Figure 9:
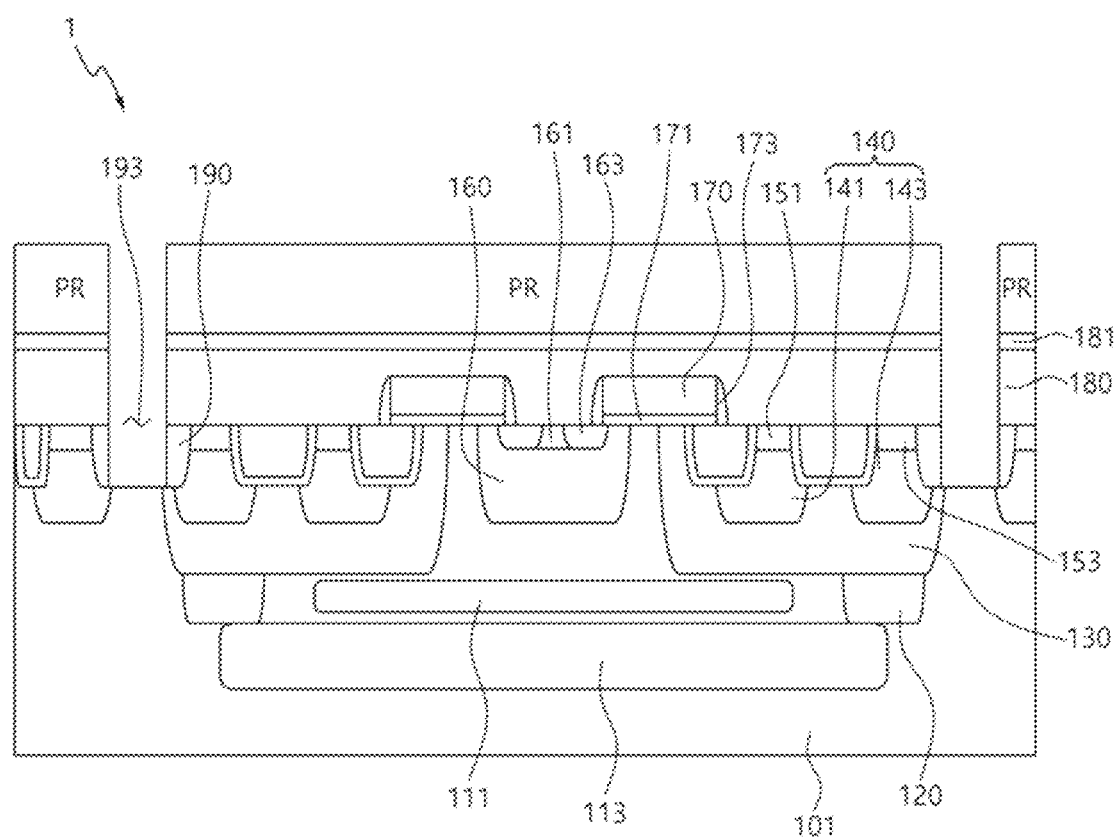

Then, referring to FIG. 9, the etch stop layer 181, the interlayer insulating layer 180, and a first device isolation structure 190 may be etched to form a first trench 193 for the pre-DTI structure 1911 that vertically overlaps the first device isolation structure 190 (e.g., an STI structure). The process of forming the first trench 193 will be described in detail. For example, a first patterned photoresist layer PR may be conventionally formed on the etch stop layer 181 so that there is an opening exposing etch stop layer 181 in a location corresponding to the first trench 193. The etch stop layer 181, the interlayer insulating layer 180, and the first device isolation structure 190 may then be sequentially etched to form the first trench 193. The patterned photoresist layer PR for forming the first trench 193 may have a cut shape or truncation in the corner region of the first trench 193 in the plan view thereof.

After the first trench 193 is formed, the first photoresist layer PR may be removed. This may comprise stripping the patterned photoresist layer PR and cleaning the resulting structure.

Figure 10:
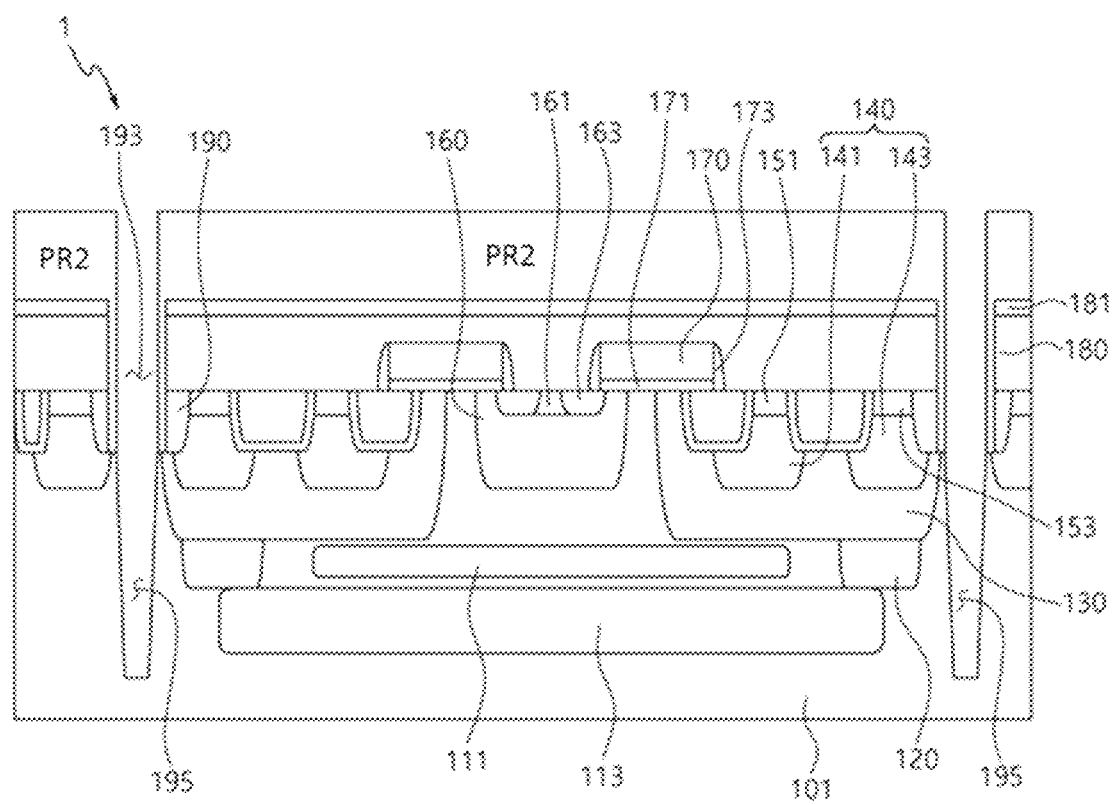

Then, referring to FIG. 10, a second trench 195 may be formed for the DTI structure 1913. The second trench 195 may have a depth in the range of 30 to 40 µm from the uppermost surface of the substrate 101. In addition, the second trench 195 may have a narrower width than the first trench 193, and may have inclined lateral walls or a substantially uniform width, as described above. The process of forming the second trench 195 will be described in detail. For example, a second patterned photoresist layer PR2 may be conventionally formed on the etch stop layer 181 and along lateral walls of the first trench 193. In other words, the second patterned photoresist layer PR2 may have an opening width a width substantially corresponding to that of the uppermost end of the second trench 195. Thereafter, the substrate 101 in the first trench 193 exposed by the second patterned photoresist layer PR2 may be etched to a depth in the range of about 30 to 40 µm (e.g., from the uppermost surface of the substrate 101). The second patterned photoresist layer PR2 may also have a cut corner or truncation in the plan view thereof.

After the second trench 195 is formed, the second patterned photoresist layer PR2 may be removed by stripping the second patterned photoresist layer PR2 and cleaning the resulting structure.

Figure 11:
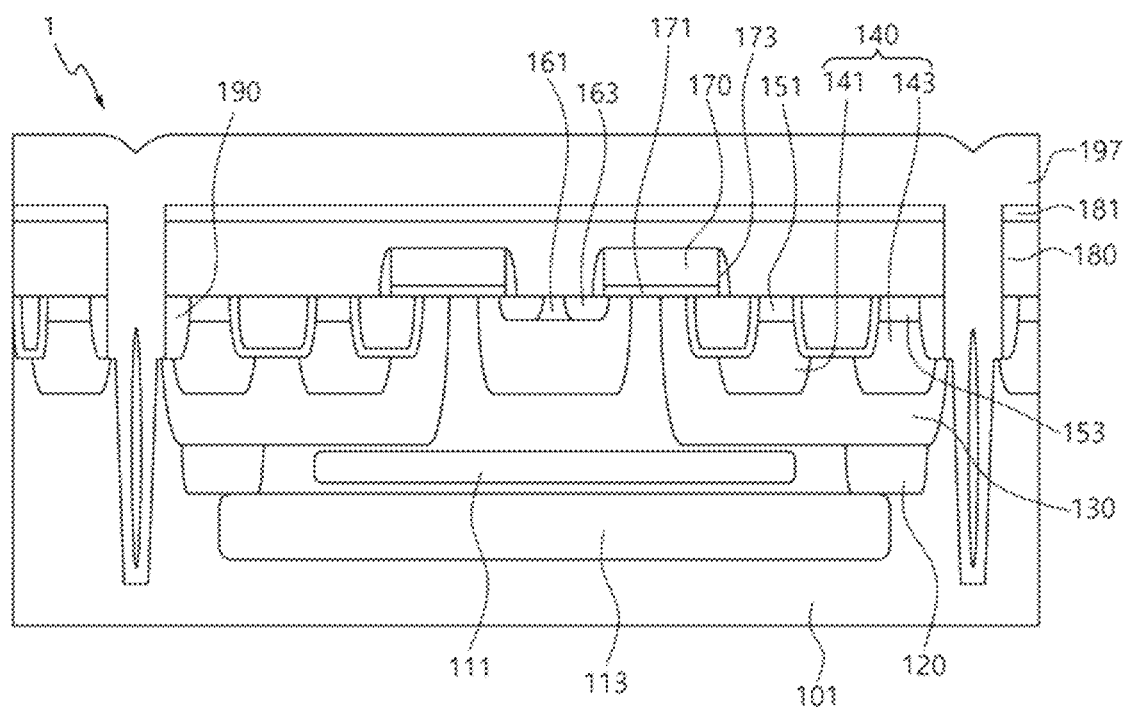

Then, referring to FIG. 11, an insulating layer 197 may be deposited on the etch stop layer 181 and in the first trench 193 and the second trench 195. The insulating layer 197 may comprise a TEOS layer, but is not limited thereto, and may be another oxide layer, such as a USG layer. During the present process, the insulating layer 197 may be deposited on the etch stop layer 181. In addition, the insulating layer 197 may be deposited into the first trench 193 and the second trench 195.

Figure 12:
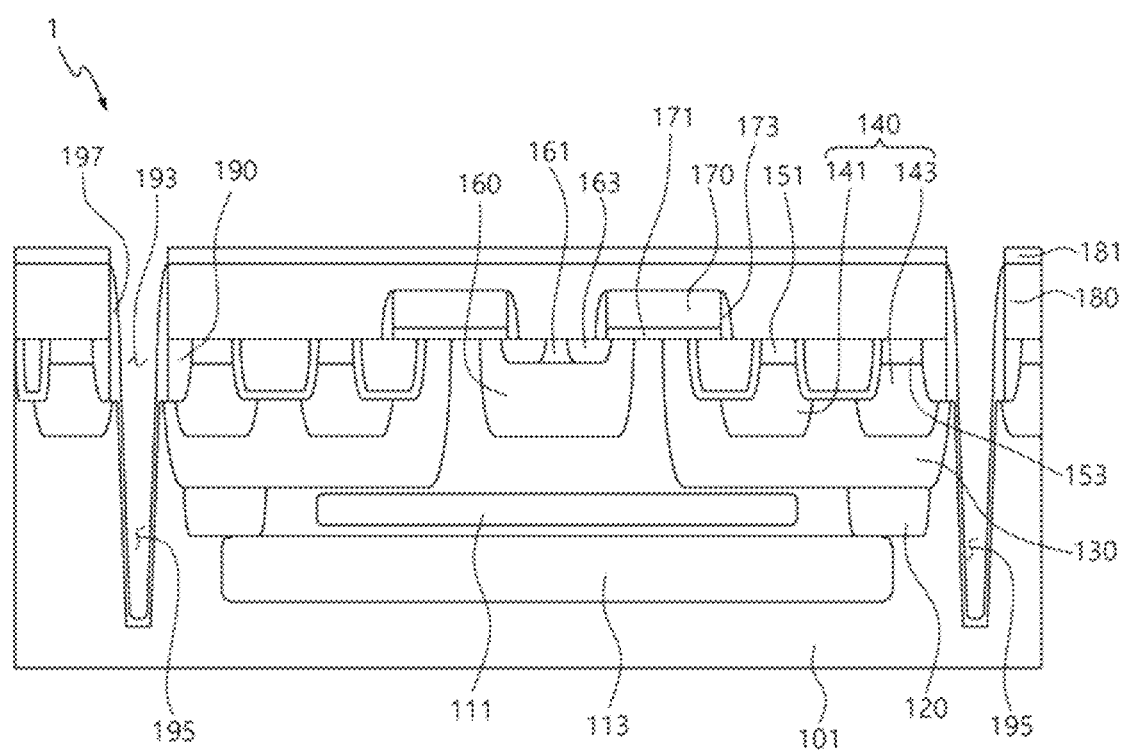

Then, referring to FIG. 12, the deposited insulating layer 197 may be etched back. The etch-back process comprises anisotropically etching the insulating layer 197 on the etch stop layer 181 and in the first trench 193 and the second trench 195 to leave sidewall spacer-like structures 197' along sidewalls of the interlayer insulating layer 180, the first device isolation structure region 190, and, optionally, the etch stop layer 181. After the insulating layer 197 is etched, the resulting structure may be cleaned. The present process thus forms the insulating sidewall structure 197' in the first trench 193 and along sidewalls of the second trench 195 (e.g., at a predetermined thickness in the second trench 195).

Figure 13:
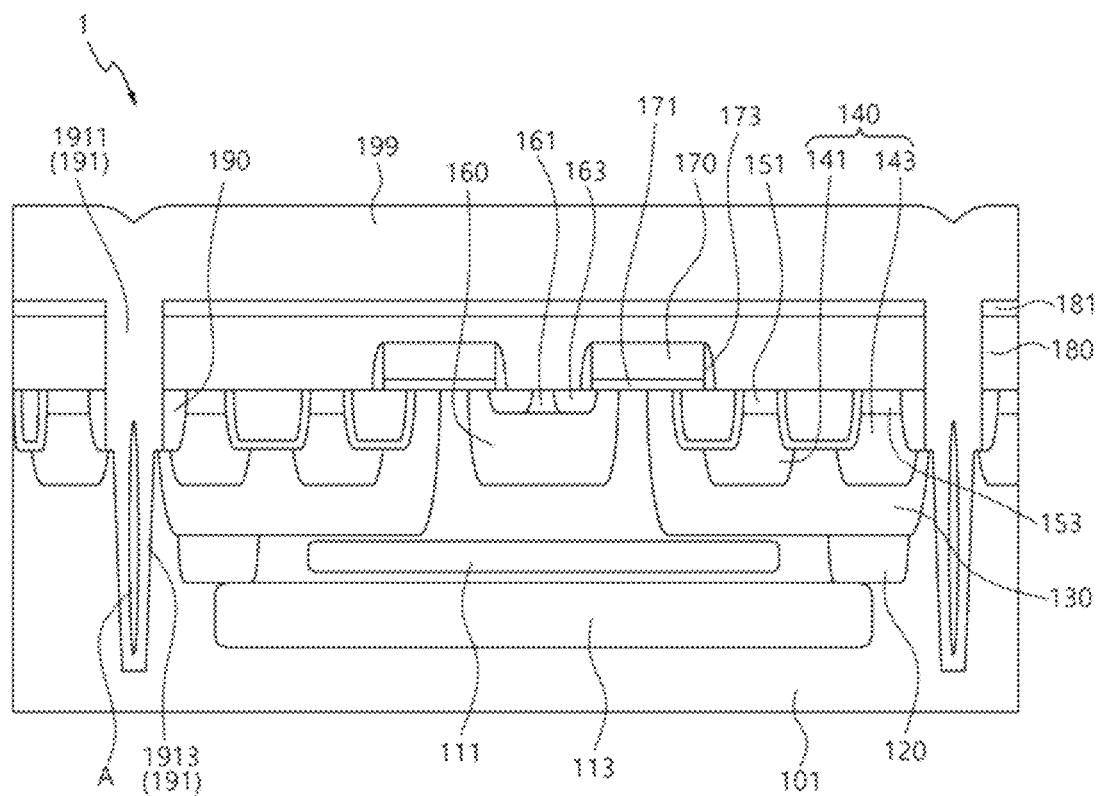

Then, referring to FIG. 13, a second insulating layer 199 may be deposited on the etch stop layer 181 and in the first trench 193 and the second trench 195. In order to distinguish it from the second insulating layer 199, the insulating layer 197 described above may be referred to as a "first insulating layer." The deposition of the second insulating layer 199 may result in an air gap A inside the first trench 193 and the second trench 195 to reduce or prevent noise between adjacent devices and improve electrical stability of the device 1.

The air gap A preferably has an upper end below the uppermost surface of the interlayer insulating layer 180, or otherwise at a height suitable for preventing penetration of tungsten (W) or the like into the air gap A in a subsequent process. By the present process, the pre-DTI structure 1911 and the DTI structure 1913 are completed. In addition, the second insulating layer 199 may comprise the same material as the first insulating layer 197, but is not limited thereto, and may be any dielectric oxide layer.

Figure 14:
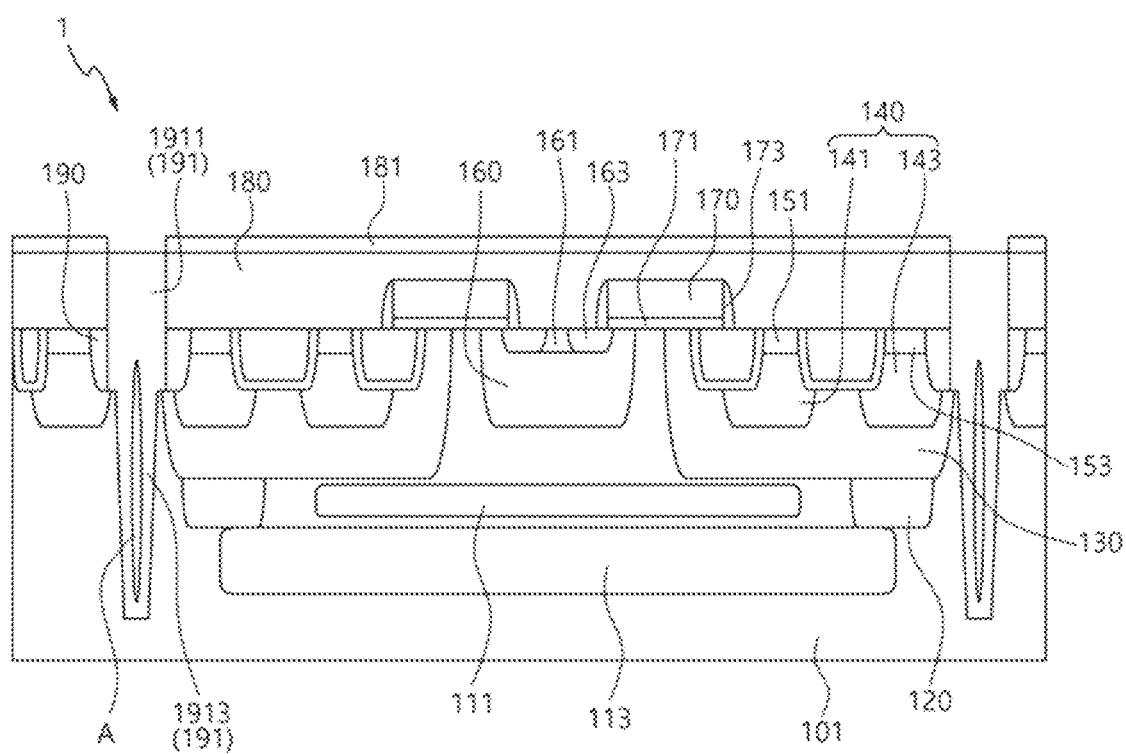

Then, referring to FIG. 14, the second insulating layer 199 on the etch and/or polish stop layer 181 may be removed (e.g., by CMP). In other words, the entire second insulating layer 199 on the etch and/or polish stop layer 181 may be removed by CMP using the etch and/or polish stop layer 181 to effectively stop the etching and/or polishing process and subsequent removal of the second insulating layer 199 from the first trench 193.

Figure 15:
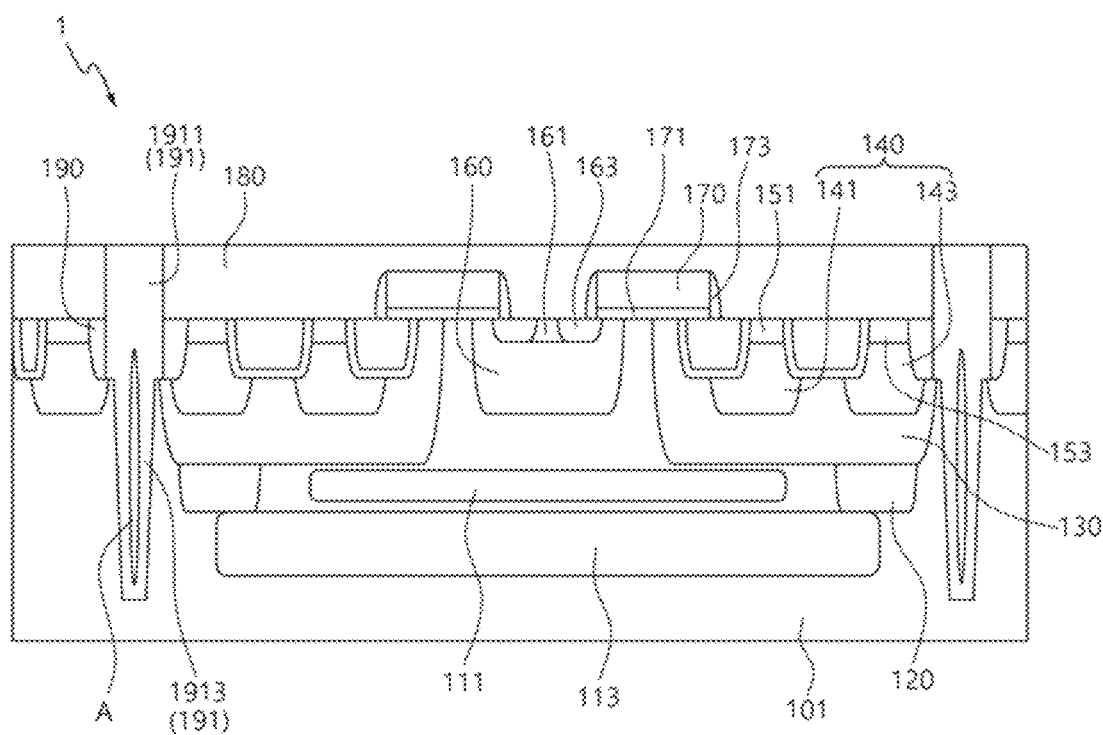

Then, referring to FIG. 15, the etch and/or polish stop layer 181 may be removed by etching, and the resulting structure may be conventionally cleaned.

The foregoing detailed description may be merely examples of the present disclosure. Also, the inventive concept may be explained by describing preferred embodiments, and can be used through various combinations, modifications, and environments. That is, the inventive concept may be amended or modified without departing from the scope of the technical idea(s) and/or knowledge in the art. The foregoing embodiments are for illustrating various modes for implementing the technical idea(s) of the present disclosure, and various modifications of the present disclosure may be made in accordance with specific applications and/or fields of use. Therefore, the foregoing detailed description of the present disclosure is not intended to limit the inventive concept to the disclosed embodiments.

What is claimed is:

1. A semiconductor device, comprising:
   a substrate;
   a gate electrode on the substrate;
   a first device isolation structure comprising a shallow trench isolation (STI) structure in the substrate;
   a second device isolation structure at least partially overlapping the first device isolation structure and extending into the substrate;
   a buried layer having a second conductivity type in the substrate;
   a deep well having the second conductivity type directly or indirectly connected to the buried layer;
   a first well having the second conductivity type in the deep well;
   a drain in the first well and at a surface of the substrate;
   a body region having a first conductivity type in the substrate;
   a source in the body region and at the surface of the substrate; and
   a body contact in the body region adjacent to the source, wherein at least one corner region of the second device isolation structure has a cut side or truncation.

2. The semiconductor device of claim 1, wherein the second device isolation structure comprises:
   a pre-DTI structure overlapping the first device isolation structure; and
   a DTI structure connected to the pre-DTI structure and extending a predetermined distance into the substrate, and having a narrower width than the pre-DTI structure.

3. The semiconductor device of claim 2, wherein the pre-DTI structure comprises a first truncation in a corner region of the pre-DTI structure in a plan view thereof.

4. The semiconductor device of claim 3, wherein the DTI structure comprises a second truncation on an outer edge of a corner region of the DTI structure in a plan view thereof.

5. The semiconductor device of claim 3, wherein a width of the corner region of the pre-DTI structure is substantially equal to a width of other regions of the pre-DTI structure at a same height.

6. The semiconductor device of claim 2, wherein the DTI structure comprises a second truncation in a corner region of the DTI structure in a plan view thereof.

7. A method of manufacturing the semiconductor device of claim 1, the method comprising:
   forming the first device isolation structure comprising the STI structure in the substrate;
   forming the gate electrode on the substrate;
   forming the interlayer insulating layer on the substrate and the gate electrode;
   forming the pre-DTI structure overlapping the first device isolation structure and having the at least one corner region with the first cut corner or truncation in the plan view thereof; and
   forming the DTI structure in the substrate, wherein the DTI structure is in contact with the pre-DTI structure.

8. The method of claim 7, wherein forming the pre-DTI structure comprises:
   etching the interlayer insulating layer on the first device isolation structure to form a first trench; and
   depositing a first insulating layer in the first trench.

9. The method of claim 8, wherein, prior to etching the interlayer insulating layer and the first device isolation structure, forming the first trench further comprises forming a first patterned photoresist layer on the interlayer insulating layer having a first opening corresponding to the first trench.

10. The method of claim 8, wherein forming the DTI structure comprises:
    after forming the first trench, etching the substrate in the first trench to form the second trench; and
    depositing a second insulating layer in the second trench.

11. The method of claim 10, wherein forming the second trench comprises:
    forming a second patterned photoresist layer on the interlayer insulating layer and in the first trench having a second opening corresponding to the second trench; and
    etching the substrate exposed by the second opening to form the second trench.

12. The method of claim 7, wherein a width of the pre-DTI structure is substantially uniform as a function of depth into the substrate.

13. A semiconductor device comprising:
    a substrate;
    a gate electrode on the substrate;
    a first device isolation structure comprising an STI structure in the substrate;
    a second device isolation structure at least partially overlapping the first device isolation structure and extending into the substrate;
    a buried layer having a second conductivity type in the substrate;
    a deep well having the second conductivity type directly or indirectly connected to the buried layer;
    a high voltage well having the second conductivity type between the buried layer and the deep well;
    a first well having the second conductivity type in the deep well;
    a drain in the first well and at a surface of the substrate;
    a body region having a first conductivity type in the substrate;
    a source in the body region and at the surface of the substrate;
    a body contact in the body region adjacent to the source, wherein:
        the second device isolation structure comprises:
            a pre-DTI structure overlapping the first device isolation structure; and
            a DTI structure connected to the pre-DTI structure and extending a predetermined distance into the substrate, and having a narrower width than the pre-DTI structure,
        the pre-DTI structure comprises a first truncation in at least one corner region of the pre-DTI structure in a plan view thereof, and
        the DTI structure comprises a second truncation in at least one corner region of the DTI structure in a plan view thereof.

14. The semiconductor device of claim 13, wherein the first truncation is along an outer edge of the pre-DTI structure in the corner region, and the second truncation is along an outer edge of the DTI structure in the corner region.

15. The semiconductor device of claim 13, wherein each of the first truncation and the second truncation has a shape resulting from cutting a corresponding corner region one time.

16. The semiconductor device of claim 13, wherein each of the first truncation and the second truncation has a shape resulting from cutting a corresponding corner region at least two times.

17. The semiconductor device of claim 13, wherein a width of the corner region of the pre-DTI structure has a difference of about 10% or less compared to a width of other regions of the pre-DTI structure.

18. The semiconductor device of claim 13, wherein a width of the corner region of the DTI structure has a difference of about 10% or less compared to a width of other regions of the DTI structure.

19. The semiconductor device of claim 13, further comprising
an air gap in the second device isolation structure.

20. The semiconductor device of claim 13, wherein the high voltage well is connected to each of the buried layer and the deep well.

* * * * *